United States Patent
Kobayashi (10) Patent No.: US 9,425,809 B2
(45) Date of Patent: Aug. 23, 2016

(54) LOCAL OSCILLATOR

(71) Applicant: KABUSHIKI KAISHA TOSHIBA, Minato-Ku, Tokyo (JP)

(72) Inventor: Hiroyuki Kobayashi, Yokohama Kanagawa (JP)

(73) Assignee: KABUSHIKI KAISHA TOSHIBA, Tokyo (JP)

( * ) Notice: Subject to any disclaimer, the term of this patent is extended or adjusted under 35 U.S.C. 154(b) by 0 days.

(21) Appl. No.: 14/834,164

(22) Filed: Aug. 24, 2015

(65) Prior Publication Data

US 2016/0204786 A1    Jul. 14, 2016

(30) Foreign Application Priority Data

Jan. 8, 2015 (JP) ................. 2015-002462

(51) Int. Cl.
| | |
|---|---|
| H03L 7/085 | (2006.01) |
| H03L 7/089 | (2006.01) |
| H03L 7/099 | (2006.01) |
| H03L 7/093 | (2006.01) |
| H03L 7/14 | (2006.01) |

(52) U.S. Cl.
CPC ............ H03L 7/0994 (2013.01); H03L 7/093 (2013.01); H03L 7/146 (2013.01); H03L 2207/50 (2013.01)

(58) Field of Classification Search
CPC ..... H03L 7/0994; H03L 7/093; H03L 7/146; H03L 2207/50
USPC ........................................... 331/1 A
See application file for complete search history.

(56) References Cited

U.S. PATENT DOCUMENTS

| | | | |
|---|---|---|---|
| 6,559,697 B2 | 5/2003 | Kikuchi | |
| 8,076,978 B2* | 12/2011 | Da Dalt | H03L 7/16 331/1 A |
| 2009/0212876 A1 | 8/2009 | Kobayashi | |
| 2012/0062289 A1* | 3/2012 | Suzuki | H03L 7/18 327/156 |

FOREIGN PATENT DOCUMENTS

| | | |
|---|---|---|
| JP | 2011229028 A | 11/2011 |
| JP | 5423967 B2 | 2/2014 |
| WO | 2009101897 A1 | 8/2009 |

* cited by examiner

Primary Examiner — Richard Tan
(74) Attorney, Agent, or Firm — Holtz, Holtz & Volek PC (57) ABSTRACT

According to an embodiment, a local oscillator includes a digitally-controlled oscillator, a frequency multiplier, a phase data generator, a subtracter, a moving average filter and a loop filter. The frequency multiplier is configured to multiply a frequency of a reference signal by N (where N is an integer of 2 or more) and generate a multiplication reference signal. The phase data generator is configured to output phase data of the oscillating signal in synchronization with the multiplication reference signal. The subtracter is configured to subtract the phase data from reference phase data and output the subtraction result as first phase error data. The moving average filter is configured to output, as second phase error data, a moving average of the consecutive N first phase error data in synchronization with the multiplication reference signal. The loop filter is configured to filter the second phase error data.

12 Claims, 6 Drawing Sheets

ID OSCILLATOR

CROSS REFERENCE TO RELATED APPLICATION

This application is based upon and claims the benefit of priority from the prior Japanese Patent Application No. 2015-002462 filed on Jan. 8, 2015 in Japan, the entire contents of which are incorporated herein by reference.

FIELD

Embodiments described herein relate generally to a local oscillator.

BACKGROUND

Recently, an all-digital phase-locked loop (ADPLL) circuit, where all control signals in a phase-locked loop (PLL) circuit are digitalized, has been used as a local oscillator in wireless communication devices, etc. In such a local oscillator, multiplying a frequency of a reference signal by a frequency multiplier and operating the PLL with the multiplied reference signal allows for setting a wider loop band. This allows for mitigating phase noise.

However, in general, since a duty ratio of the reference signal is not 50%, the multiplied reference signal includes a phase offset. Therefore, the multiplied reference signal disadvantageously includes frequency components of the reference signal. Due to this, spurs corresponding to the frequency of the reference signal are generated in the vicinity of an oscillating frequency. It is desired that such spurs be reduced.

DETAILED DESCRIPTION

According to an embodiment, a local oscillator includes a digitally-controlled oscillator, a frequency multiplier, a phase data generator, a subtracter, a moving average filter and a loop filter. The digitally-controlled oscillator is capable of controlling an oscillating frequency of an oscillating signal based on an oscillator control value which is a digital value. The frequency multiplier is configured to multiply a frequency of a reference signal by N (where N is an integer of 2 or more) and generate a multiplication reference signal. The phase data generator is configured to output phase data of the oscillating signal in synchronization with the multiplication reference signal, the phase data being a digital value. The subtracter is configured to subtract the phase data from reference phase data for setting the oscillating frequency and output the subtraction result as first phase error data. The moving average filter is configured to output, as second phase error data, a moving average of the consecutive N first phase error data in synchronization with the multiplication reference signal. The loop filter is configured to filter the second phase error data and output the oscillator control value.

Embodiments will now be explained with reference to the accompanying drawings.

First Embodiment

Figure 1:
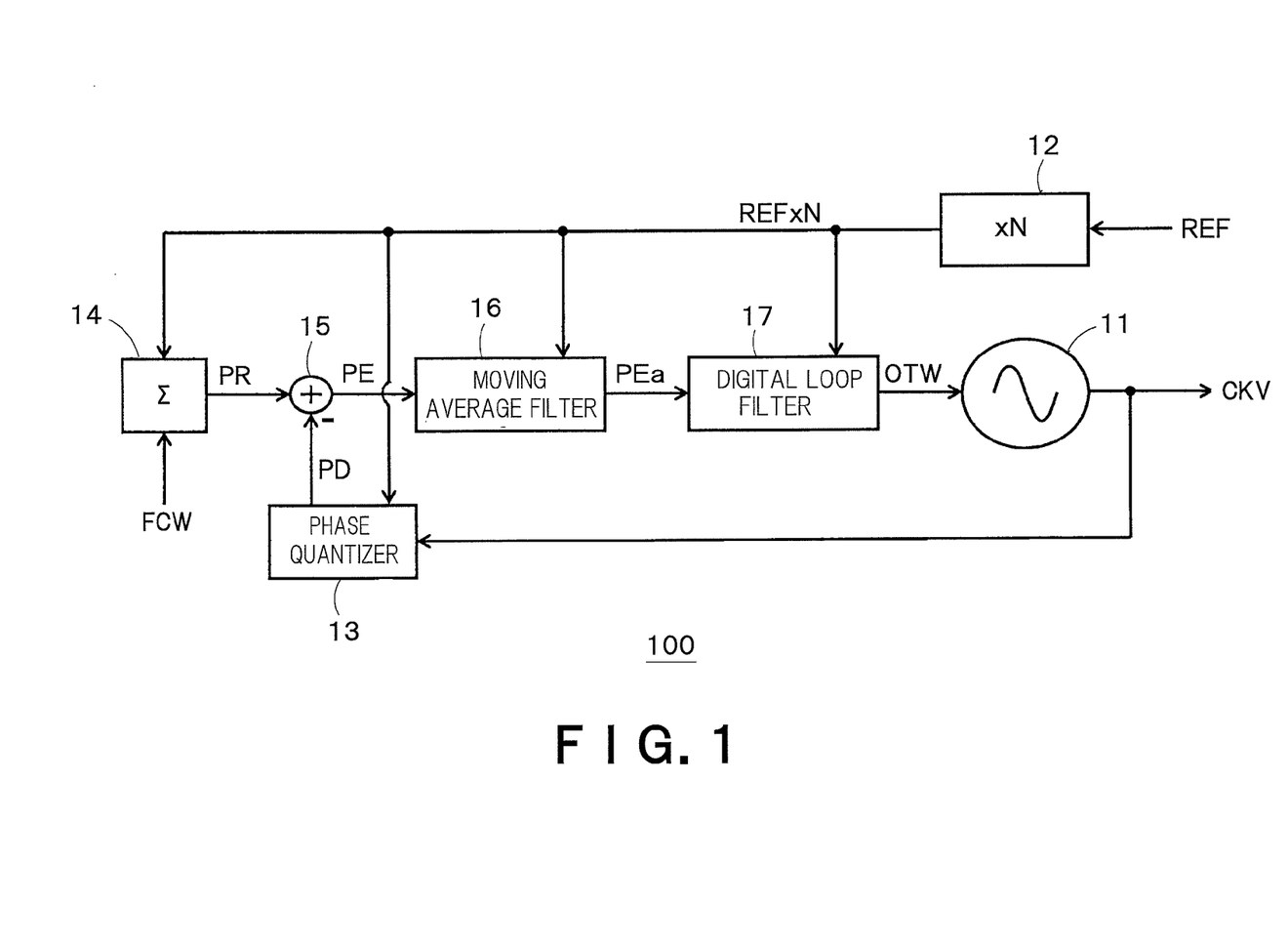
FIG. 1 is a block diagram showing a schematic configuration of a local oscillator according to a first embodiment.

FIG. 1 is a block diagram showing a schematic configuration of a local oscillator (ADPLL circuit) 100 according to a first embodiment. As shown in FIG. 1, the local oscillator 100 includes a digitally-controlled oscillator 11, a frequency multiplier 12, a phase data generator (phase quantizer) 13, an accumulator 14, a subtracter 15, a moving average filter 16, and a loop filter (digital loop filter) 17. The components other than the digitally-controlled oscillator 11 are digital circuits. The frequency multiplier 12 may be an analog circuit.

The digitally-controlled oscillator 11 can discretely control an oscillating frequency FCKV of an oscillating signal KEV based on an oscillator control value OTW which is a digital value.

The frequency multiplier 12 multiplies a frequency FREF of the reference signal REF by N (where N is an integer of 2 or more) and generates a multiplication reference signal REF×N.

The phase data generator 13, in synchronization with the multiplication reference signal REF×N, outputs phase data PD of an oscillating signal CKV. The phase data PD is a digital value. For example, when the PLL is in a steady state with the oscillating frequency FCKV at 10 MHz, a frequency FREF×N of the multiplication reference signal REF×N at 2 MHz, and a duty ratio of the reference signal REF at 50%, the phase data generator 13 outputs, as phase data PD, approximately 5, 10, 15, . . . in the order mentioned at each rising edge of the multiplication reference signal REF×N. In this example of the frequency, when the duty ratio of the reference signal REF is not 50%, the phase data PD takes a different value.

The accumulator 14 accumulates setting frequency data FCW in synchronization with the multiplication reference signal REF×N, and outputs the accumulated setting frequency data as reference phase data PR for setting the oscillating frequency FCKV. The setting frequency data FCW is data for setting the oscillating frequency FCKV, and is obtained by dividing a setting frequency by the frequency FREF×N of the multiplication reference signal REF×N. For example, when the setting frequency is 10 MHz and the frequency FREF×N is 2 MHz, the setting frequency data FCW is 5. In this case, the accumulator 14 outputs, as the reference phase data PR, 5, 10, 15 . . . in the order mentioned at each rising edge of the multiplication reference signal REF×N. The reference phase data PR is not dependent on the duty ratio of the reference signal REF.

The subtracter 15 subtracts the phase data PD from the reference phase data PR, and then outputs the subtraction result as first phase error data PE. In the numerical example described above, the subtracter 15 outputs, as the first phase error data PE, approximately 0, 0, 0 . . . in the order mentioned at each rising edge of the multiplication reference signal REF×N.

The moving average filter 16, in synchronization with the multiplication reference signal REF×N, outputs, as second phase error data PEa, the moving average of the first phase error data PE from (N−1) clocks before to the present clock (consecutive N first phase error data PE). In other word, at a certain time, the second phase error data PEa is an average of the consecutive N first phase error data PE.

The loop filter 17 operates as a low pass filter, and filters the second phase error data PEa and outputs the oscillator control value OTW in synchronization with the multiplication reference signal REF×N. The higher the frequency FREF×N of the multiplication reference signal REF×N is, the higher a cut-off frequency of the loop filter 17 is set.

In this manner, the phase data generator 13, the accumulator 14, the moving average filter 16, and the loop filter 17 operate in synchronization with the multiplication reference signal REF×N. This allows for mitigating quantization noise as compared to operation in synchronization with the reference signal REF.

Figure 2A:
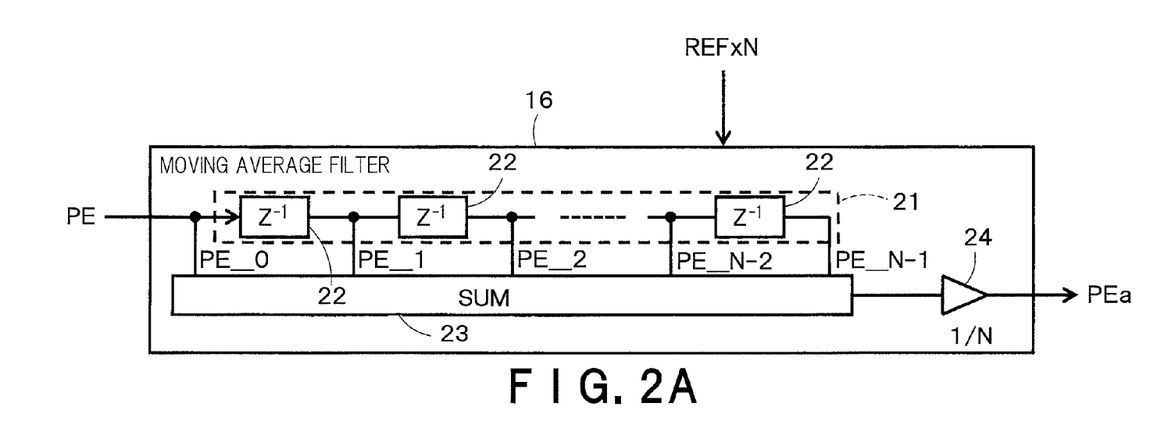
FIG. 2A is a block diagram showing a schematic configuration of a moving average filter shown in FIG. 1.

FIG. 2A is a block diagram showing a schematic configuration of the moving average filter 16 shown in FIG. 1. As shown in FIG. 2A, the moving average filter 16 includes a delay circuit 21 of (N−1) stages, an adder 23, and a divider 24.

The delay circuit 21 has serially-connected (N−1) delay elements 22, delays the first phase error data PE in synchronization with the multiplication reference signal REF×N, and outputs (N−1) output data PE_1 to PE_N−1. For example, the output data PE_N−1 is the first phase error data PE, (N−1) clocks before. The output data PE_1 is the first phase error data PE one clock before.

The adder 23 calculates the sum of the present first phase error data PE_0 and the output data PE_1 to PE_N−1 from the delay circuit 21.

The divider 24 outputs, as the second phase error data PEa, the sum divided by N, the sum being calculated by the adder 23. Therefore, the second phase error data PEa is obtained from the equation: PEa=(PE_0+PE_1+ ... +PE_N−1)/N.

Next, operation of the local oscillator 100, where N=2, will be described with reference to FIGS. 2B and 3.

Figure 2B:
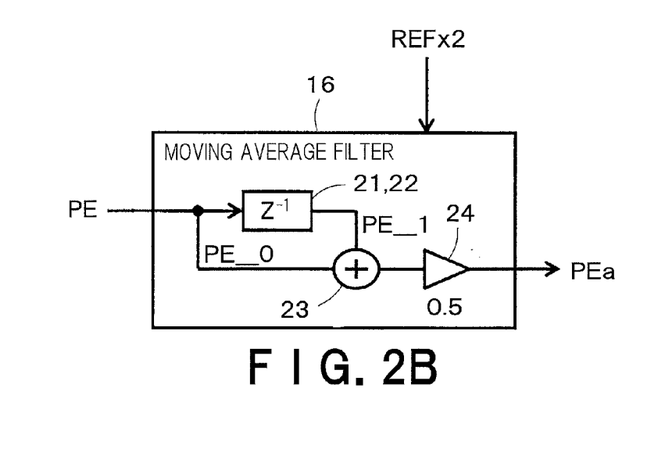
FIG. 2B is a block diagram showing a schematic configuration of the moving average filter in FIG. 1 where N=2.

FIG. 2B is a block diagram showing a schematic configuration of the moving average filter 16 in FIG. 1 where N=2. As shown in FIG. 2B, a delay circuit 21 of 1 stage outputs output data PE_1. Therefore, the second phase error data PEa is obtained from the equation: PEa=(PE_0+PE_1)/2.

Figure 3:
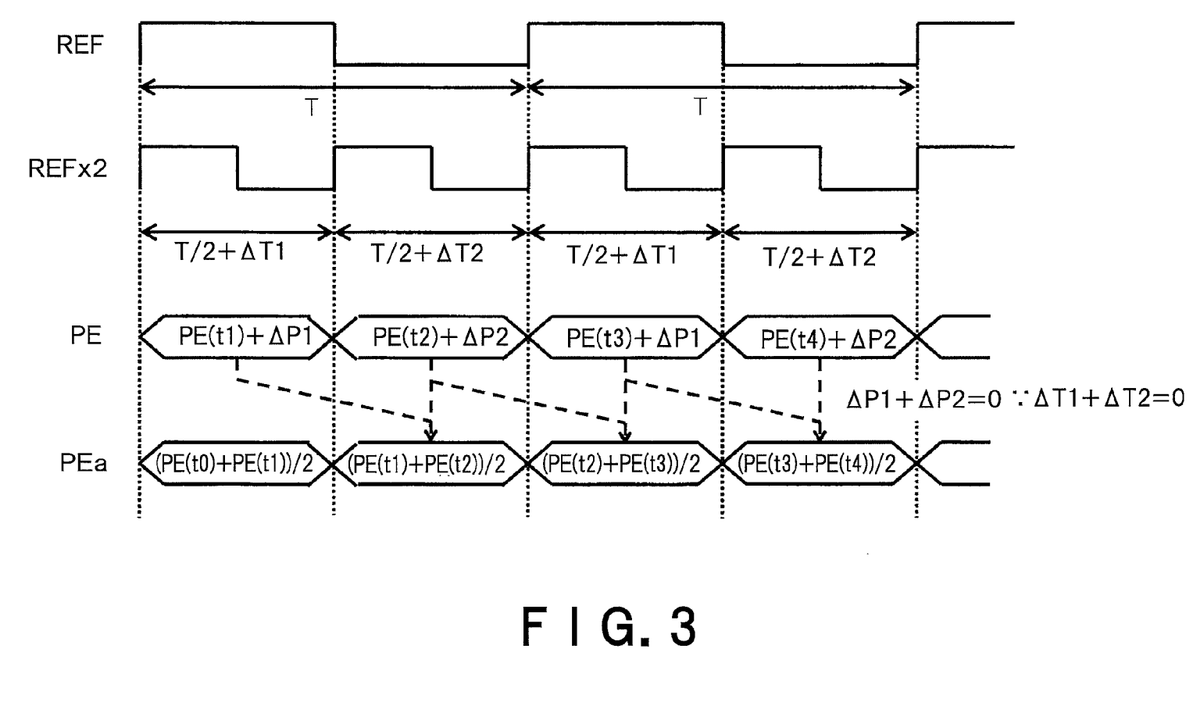
FIG. 3 is a timing chart of the local oscillator in FIG. 1 where N=2.

FIG. 3 is a timing chart of the local oscillator 100 in FIG. 1 where N=2. As shown in FIG. 3, a cycle of the reference signal REF is defined as T (sec). When a duty ratio of the reference signal REF is ideally 50%, a cycle of the multiplication reference signal REF×2, where the frequency FREF of the reference signal REF is multiplied by 2, is T/2.

In reality, however, the duty ratio of the reference signal REF is not 50%, and thus, each cycle of the multiplication reference signal REF×2 has an error when compared to T/2. When the differences between respective cycles of the multiplication reference signal REF×2 within a cycle T of the reference signal REF and the ideal cycles T/2 are defined as an error $\Delta T1$ and an error $\Delta T2$, respectively, the respective cycles of the multiplication reference signal REF×2 within the cycle T are expressed as T/2+$\Delta T1$ and T/2+$\Delta T2$.

Here, since fluctuation of the cycle T of the reference signal REF is sufficiently small, the cycle T may be deemed as constant. Therefore, the equation (T/2+$\Delta T1$)+(T/2+$\Delta T2$)=T typically holds. That is, the sum of the errors $\Delta T1$ and $\Delta T2$ generated by multiplication, within the cycle T of the reference signal REF, typically equals 0.

Therefore, when the first phase error data PE of respective cycles of the multiplication reference signal REF×2, where the duty ratio of the reference signal REF is ideally 50%, is defined as reference phase error data PE (tn) (where n is an integer of 0 or more), and the differences between the first phase error data PE of respective cycles of the multiplication reference signal REF×2 having a phase offset and the reference phase error data PE (tn) are defined as an error $\Delta P1$ and an error $\Delta P2$, respectively, the sum of the errors $\Delta P1$ and $\Delta P2$ within the cycle T of the reference signal REF also equals 0.

Therefore, the moving average of the first phase error data PE from one clock before to the present clock (namely, the second phase error data PEa) is, for example, expressed by ((PE(t1)+$\Delta P1$)+(PE(t2)+$\Delta P2$))/2=(PE(t1)+PE(t2))/2=PEa (t2), which is an average error of two clocks independent from a phase error caused by the phase offset.

That is, the second phase error data PEa not including errors $\Delta P1$ and $\Delta P2$ caused by the phase offset can be obtained. Therefore, by controlling the oscillating frequency FCKV based on the second phase error data PEa, occurrence of spurs corresponding to the frequency FREF of the reference signal REF can be suppressed.

In the above, the case of multiplication by 2 has been described for clarity of description. The same also applies to a case of multiplication by N. That is, the sum of differences between respective cycles of the multiplication reference signal REF×N within the cycle T of the reference signal REF and T/N (errors $\Delta T1$ to $\Delta TN$) equals 0.

Therefore, when the differences between the first phase error data PE of respective cycles of the multiplication reference signal REF×N and the reference phase error data PE (tn) are defined as errors $\Delta P1$ to $\Delta PN$, the sum of the errors $\Delta P1$ to $\Delta PN$ also equals 0.

Therefore, the moving average of the first phase error data PE from (N−1) clocks before to the present clock (namely, the second phase error data PEa) is, for example, expressed by ((PE(t1)+$\Delta P1$)+ ... +(PE(tn)+$\Delta PN$))/N=PEa(tn). Therefore, errors $\Delta P1$ to $\Delta PN$ caused by the phase offset can be excluded.

As described above, in the embodiment, the moving average filter 16 which outputs, as the second phase error data PEa, the moving average of the first phase error data PE from (N−1) clocks before to the present clock is provided. This allows for obtaining the second phase error data PEa not including errors $\Delta P1$ to $\Delta PN$ caused by the phase offset. Therefore, by controlling the oscillating frequency FCKV based on the second phase error data PEa, occurrence of spurs corresponding to the frequency FREF of the reference signal REF can be suppressed.

Furthermore, operating the PLL in synchronization with the multiplication reference signal REF×N allows for setting a wider loop band and mitigating quantization noise as compared to operation using the reference signal REF. This also allows for mitigating phase noise.

In this manner, the simple configuration adding the moving average filter 16 allows for mitigating spurs and phase noise.

COMPARATIVE EXAMPLE

Here, a comparative example of a local oscillator known to the present inventor will be described.

Figure 6:
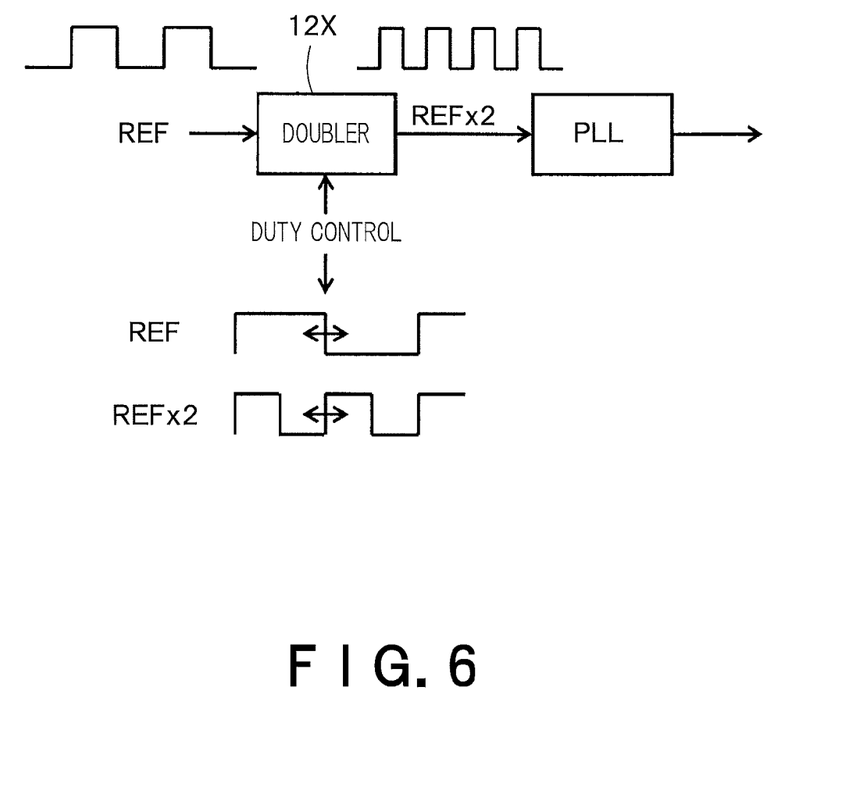
FIG. 6 is a diagram for describing a local oscillator of a comparative example.

FIG. 6 is a diagram for describing the local oscillator of the comparative example. The local oscillator of the comparative example is an analog PLL circuit, where a duty ratio of a reference signal REF is controlled by adjusting a delay in a falling edge of the reference signal REF by a frequency multiplier 12X. This control is performed by, for example, adjusting an electrical current in the frequency multiplier 12X by an analog circuit (not shown). As a result, a duty ratio of the reference signal REF approximates 50%, thereby mitigating a phase offset of the multiplication reference signal FREF×2. Therefore, occurrence of spurs corresponding to a frequency of the reference signal REF can be suppressed. Such adjustment by an analog circuit requires a large area.

In the first embodiment and a second embodiment, which will be described below, occurrence of spurs is suppressed by a digital circuit without using such an analog circuit.

Second Embodiment

In a second embodiment, an amount of shift in a phase error data PE caused by a phase offset is detected. Based on this detected amount of shift, first setting frequency data FCW is corrected.

Figure 4:
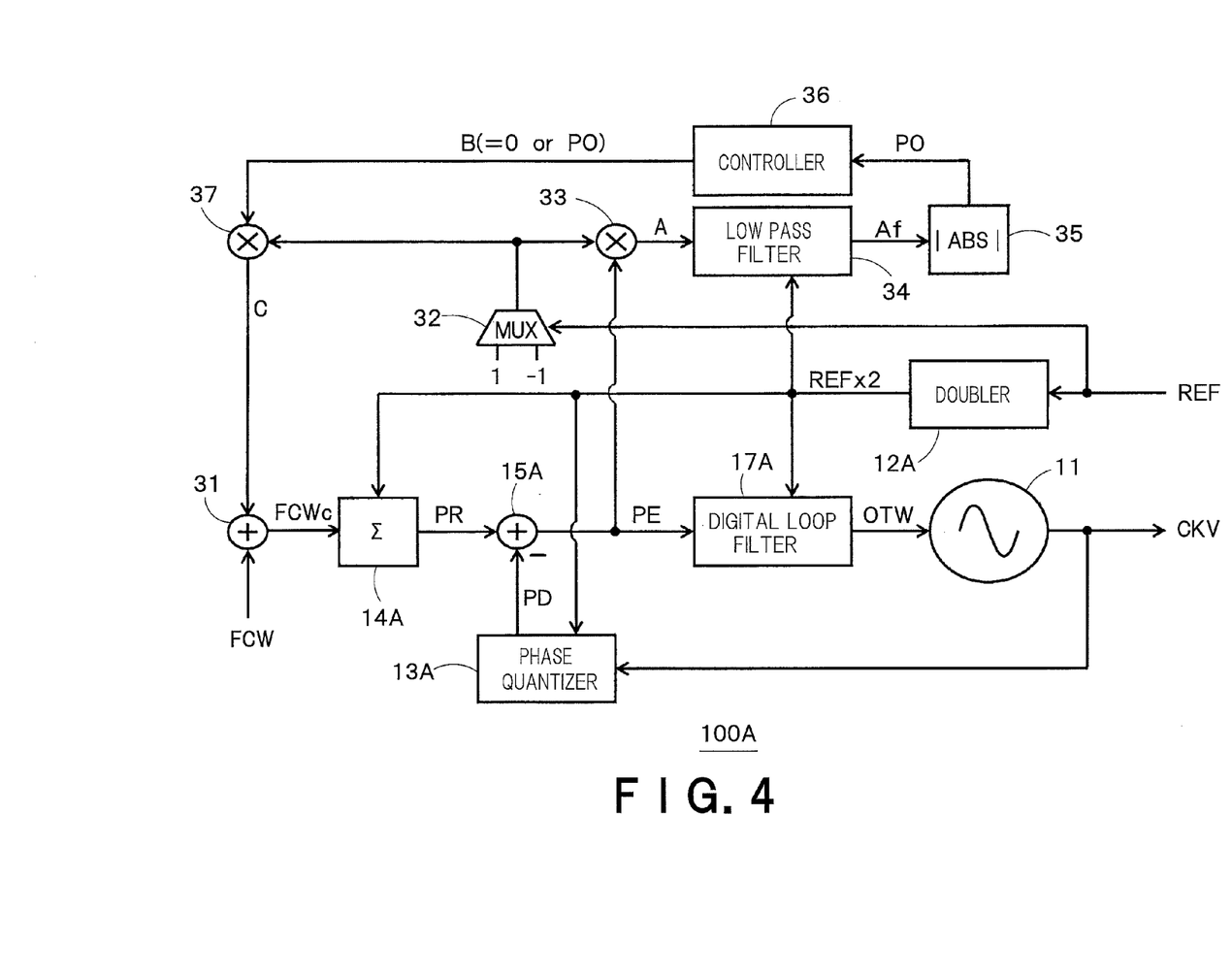
FIG. 4 is a block diagram showing a schematic configuration of a local oscillator according to a second embodiment.

FIG. 4 is a block diagram showing a schematic configuration of a local oscillator 100A according to the second embodiment. In FIG. 4, components common to those in FIG. 1 are indicated by the same symbols as in FIG. 1, and different points are mainly described below.

As shown in FIG. 4, the local oscillator 100A includes a digitally-controlled oscillator 11, a frequency multiplier (doubler) 12A, a phase data generator (phase quantizer) 13A, an accumulator 14A, an adder 31, a subtracter 15A, a loop filter 17A, a multiplexer 32, a first multiplier 33, a low pass filter 34, an absolute value calculating circuit 35, a controller 36, and a second multiplier 37. The components other than the digitally-controlled oscillator 11 are digital circuits. The frequency multiplier 12A may be an analog circuit.

The frequency multiplier 12A multiplies a frequency FREF of a reference signal REF by 2 and outputs a multiplication reference signal REF×2.

The phase data generator 13A outputs phase data PD of an oscillating signal CKV in synchronization with the multiplication reference signal REF×2. The phase data PD is a digital value.

The adder 31 adds correction data C to first setting frequency data FCW for setting an oscillating frequency FCKV and outputs the addition result as second setting frequency data FCWc. The first setting frequency data FCW is obtained by dividing a setting frequency by a frequency FREF×2 of the multiplication reference signal REF×2.

The accumulator 14A accumulates the second setting frequency data FCWc in synchronization with the multiplication reference signal REF×2, and outputs the accumulated setting frequency data as reference phase data PR.

The subtracter 15A subtracts the phase data PD from the reference phase data PR, and then outputs the subtraction result as the phase error data PE.

The loop filter 17A operates as a low pass filter, filters the phase error data PE, and outputs an oscillator control value OTW in synchronization with the multiplication reference signal REF×2.

The multiplexer 32 outputs, to the first multiplier 33 and the second multiplier 37, +1 or −1 selected according to the reference signal REF. More specifically, the multiplexer 32 selects +1 or −1 according to a logic level of the reference signal REF. For example, the multiplexer 32 may select +1 when the reference signal REF is "1" (high level) and −1 when the reference signal REF is "0" (low level), or vice versa.

The first multiplier 33 multiplies the phase error data PE by +1 or −1, output from the multiplexer 32, and outputs the multiplication result as first data A. That is, the first multiplier 33 multiplies the phase error data PE by +1 or −1 according to the reference signal REF.

The low pass filter 34, in synchronization with the multiplication reference signal REF×2, filters the first data A and outputs second data Af.

The absolute value calculating circuit 35 outputs, as phase offset data PO, an absolute value of the second data Af.

The controller 36 outputs 0 as third data B until a predetermined time elapses from activation of the local oscillator 100A. After the predetermined time has elapsed, the controller 36 outputs, as third data B, the phase offset data PO supplied from the absolute value calculating circuit 35. The predetermined time is longer than a lock-up time where the oscillating frequency FCKV is stabilized.

The second multiplier 37 multiplies the third data B by +1 or −1 output from the multiplexer 32 and outputs the multiplication result as correction data C. That is, the second multiplier 37 multiplies the third data B by +1 or −1 according to the reference signal REF.

Figure 5:
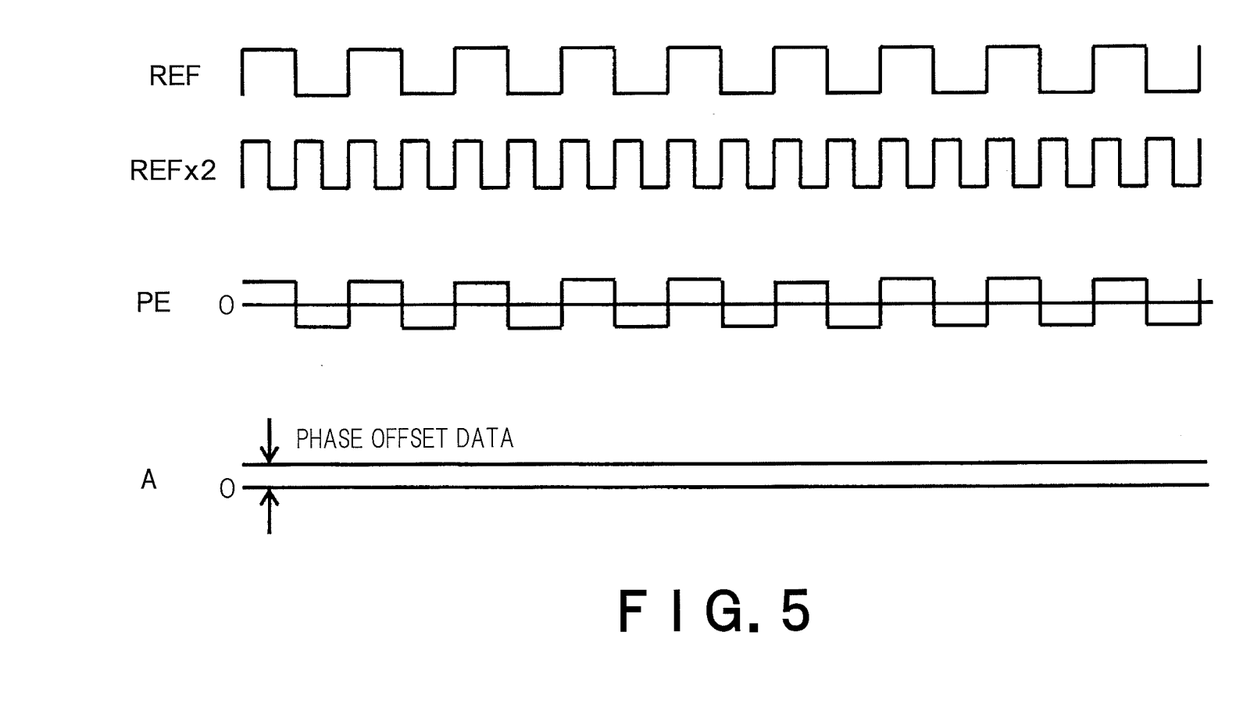
FIG. 5 is a timing chart of the local oscillator in FIG. 4.

FIG. 5 is a timing chart of the local oscillator 100A in FIG. 4. FIG. 5 is a diagram where a default value 0 is output as the third data B and the local oscillator 100A is locked.

In the example shown, a duty ratio of the reference signal REF deviates from 50%. Therefore, the multiplication reference signal REF×2 includes a phase offset. Under locked status, since an increased amount of the phase data PD increases or decreases according to the phase offset of the multiplication reference signal REF×2, the phase error data PE alternately changes between positive and negative for each cycle of the multiplication reference signal REF×2. In the example shown, the phase error data PE is positive when the reference signal REF is at a high level and negative when the reference signal REF is at a low level. An amount of shift in the phase error data PE to positive or negative corresponds to the phase offset. In this situation, spurs corresponding to the frequency FREF of the reference signal REF occur.

Since the first multiplier 33 multiplies the phase error data PE by +1 or −1 according to the reference signal REF, the first data A corresponding to the phase offset can be obtained. In the example shown, the first multiplier 33 multiplies the positive phase error data PE by +1 when the reference signal REF is at a high level. When the reference signal REF is at a low level, the first multiplier 33 multiplies the negative phase error data PE by −1. This provides the positive first data A. Depending on a setting of the multiplexer 32, the negative first data A may be obtained.

The low pass filter 34 removes variations in the first data A, and then outputs the second data Af. When the local oscillator 100A is locked, since an average value of the phase error data PE is 0, data showing an amount of the phase offset remains as the second data Af.

Since the absolute value calculating circuit 35 outputs, as the phase offset data PO, the absolute value of the second data Af, the positive phase offset data PO can be obtained even when the first data A is negative.

Next, after the predetermined time has elapsed and the phase offset data PO has been stabilized, the controller 36 retains the stabilized phase offset data PO and then outputs the retained value as the third data B. The adder 31, in synchronization with the reference signal REF, repeats addition of the phase offset data PO to the first setting frequency data FCW and subtraction of the phase offset data PO from the first setting frequency data FCW in an alternate manner.

In this manner, the second setting frequency data FCWc can be increased or decreased according to an increase or decrease of the increased amount of the phase data PD according to the phase offset. Therefore, reference phase data PR is corrected such that the reference phase data PR substantially matches the phase data PD, thereby correcting the shift in the phase error data PE caused by the phase offset. That is, the same phase error data PE as in the case where the duty ratio is 50% is obtained. Therefore, spurs corresponding to the frequency FREF of the reference signal REF can be suppressed.

As described above, in this embodiment, the phase error data PE is multiplied by +1 or −1 according to the reference signal REF, and then the phase offset data PO based on the multiplication result is added to or subtracted from the first setting frequency data FCW in an alternate manner. This allows for correcting the shift in the phase error data PE caused by the phase offset of the multiplication reference signal REF×2. Therefore, occurrence of spurs corresponding to the frequency FREF of the reference signal REF can be suppressed.

Furthermore, operating the PLL in synchronization with the multiplication reference signal REF×2 allows for setting a wider loop band and mitigating quantization noise as compared to operation using the reference signal REF. This also allows for mitigating phase noise.

While certain embodiments have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

The invention claimed is:

1. A local oscillator comprising:
   a digitally-controlled oscillator capable of controlling an oscillating frequency of an oscillating signal based on an oscillator control value which is a digital value;
   a frequency multiplier configured to multiply a frequency of a reference signal by N, where N is an integer of 2 or more, and generate a multiplication reference signal;
   a phase data generator configured to output phase data of the oscillating signal in synchronization with the multiplication reference signal, the phase data being a digital value;
   a subtractor configured to subtract the phase data from reference phase data for setting the oscillating frequency and output a subtraction result as first phase error data;
   a moving average filter configured to output, as second phase error data, a moving average of consecutive N first phase error data in synchronization with the multiplication reference signal; and
   a loop filter configured to filter the second phase error data and output the oscillator control value.

2. The local oscillator according to claim 1, wherein:
   one cycle of the reference signal is defined as T, and
   a sum of differences between respective cycles of the multiplication reference signal within the cycle T and T/N equals 0.

3. The local oscillator according to claim 1, wherein the moving average filter comprises:

a delay circuit of N−1 stages configured to delay the first phase error data in synchronization with the multiplication reference signal;
an adder configured to calculate a sum of the first phase error data and output data from the delay circuit; and
a divider configured to output the sum divided by N as the second phase error data.

4. The local oscillator according to claim 3, wherein:
   the delay circuit comprises serially-connected N−1 delay elements and is configured to output the N−1 output data, and
   the output data is the first phase error data from N−1 clocks before to one clock before.

5. The local oscillator according to claim 1, further comprising:
   an accumulator configured to accumulate setting frequency data in synchronization with the multiplication reference signal, and output the accumulated setting frequency data as the reference phase data,
   wherein the setting frequency data is obtained by dividing a setting frequency by a frequency of the multiplication reference signal.

6. The local oscillator according to claim 1, wherein the loop filter operates in synchronization with the multiplication reference signal.

7. A local oscillator comprising:
   a digitally-controlled oscillator capable of controlling an oscillating frequency of an oscillating signal based on an oscillator control value which is a digital value;
   a frequency multiplier configured to multiply a frequency of a reference signal by 2 and output a multiplication reference signal;
   a phase data generator configured to output phase data of the oscillating signal in synchronization with the multiplication reference signal, the phase data being a digital value;
   an adder configured to add correction data to first setting frequency data for setting the oscillating frequency and output the addition result as second setting frequency data;
   an accumulator configured to accumulate the second setting frequency data in synchronization with the multiplication reference signal, and output the accumulated second setting frequency data as reference phase data;
   a subtractor configured to subtract the phase data from the reference phase data, and output a subtraction result as phase error data;
   a loop filter configured to filter the phase error data and output the oscillator control value;
   a first multiplier configured to multiply the phase error data by +1 or −1 according to the reference signal, and output a multiplication result as first data;
   a low pass filter configured to filter the first data and output second data;
   an absolute value calculating circuit configured to output an absolute value of the second data as phase offset data;
   a controller configured to output 0 as third data until a predetermined time elapses, and output the phase offset data as the third data after the predetermined time has elapsed; and
   a second multiplier configured to multiply the third data by +1 or −1 according to the reference signal and output the multiplication result as the correction data.

8. The local oscillator according to claim 7, wherein the predetermined time is longer than a lock-up time where the oscillating frequency is stabilized.

9. The local oscillator according to claim 7, further comprising:
- a multiplexer configured to output +1 or −1 selected according to the reference signal, to the first multiplier and the second multiplier.

10. The local oscillator according to claim 9, wherein the multiplexer selects +1 or −1 according to a logic level of the reference signal.

11. The local oscillator according to claim 7, wherein the first setting frequency data is obtained by dividing a setting frequency by a frequency of the multiplication reference signal.

12. The local oscillator according to claim 7, wherein the loop filter and the low pass filter operate in synchronization with the multiplication reference signal.

* * * * *